(12) United States Patent
Kim et al.

(10) Patent No.: US 10,895,023 B2
(45) Date of Patent: Jan. 19, 2021

(54) NANOFIBER-NANOWIRE COMPOSITE AND PREPARATION METHOD THEREFOR

(71) Applicant: KOREA UNIVERSITY RESEARCH AND BUSINESS FOUNDATION, Seoul (KR)

(72) Inventors: Young Keun Kim, Seoul (KR); Bum Chul Park, Daejeon (KR); Ji-Beom Shin, Seoul (KR)

(73) Assignee: KOREA UNIVERSITY RESEARCH AND BUSINESS FOUNDATION, Seoul (KR)

(*) Notice: Subject to any disclaimer, the term of this patent is extended or adjusted under 35 U.S.C. 154(b) by 258 days.

(21) Appl. No.: 16/043,623

(22) Filed: Jul. 24, 2018

(65) Prior Publication Data

US 2018/0347075 A1    Dec. 6, 2018

Related U.S. Application Data

(63) Continuation of application No. PCT/KR2017/000343, filed on Jan. 10, 2017.

(30) Foreign Application Priority Data

Aug. 30, 2016  (KR) .......................... 10-2016-0110970

(51) Int. Cl.
*D01F 11/08* (2006.01)
*B29C 48/00* (2019.01)
(Continued)

(52) U.S. Cl.
CPC ............ *D01F 11/08* (2013.01); *B29C 48/002* (2019.02); *B29C 48/022* (2019.02);
(Continued)

(58) Field of Classification Search
CPC ..... B29C 48/08; B29C 48/022; B29C 48/002; B29C 48/148; D01F 11/08; C30B 7/10; C30B 29/16; C30B 29/60
See application file for complete search history.

(56) References Cited

U.S. PATENT DOCUMENTS

| 8,852,316 B2* | 10/2014 | Sastry | ................... B22F 1/0018 75/371 |
| 2010/0009267 A1* | 1/2010 | Chase | ................. H01M 10/052 429/320 |
| 2011/0177332 A1* | 7/2011 | Park | ........................ C08L 71/02 428/364 |

FOREIGN PATENT DOCUMENTS

| CN | 103901081 B | 7/2014 |
| JP | 2010-0162685 A | 7/2010 |

(Continued)

OTHER PUBLICATIONS

Extended European Search Report dated Mar. 3, 2020, in connection with the European Patent Application No. 17846767.6.

(Continued)

*Primary Examiner* — Michael P Wieczorek
(74) *Attorney, Agent, or Firm* — Hauptman Ham, LLP

(57) ABSTRACT

Provided are a nanofiber-nanowire composite and a method for producing the same. The method includes preparing a nanoparticle using a dipolar solvent, producing a nanofiber-nanoparticle composite in an electrospinning synthesis solution including the nanoparticle through electrospinning, and growing a nanowire from the nanoparticle by hydrothermally synthesizing a dried nanofiber-nanoparticle composite.

9 Claims, 6 Drawing Sheets

(51) Int. Cl.
  *B29C 48/02* (2019.01)
  *D01F 1/10* (2006.01)
  *D01F 11/00* (2006.01)
  *D04H 1/728* (2012.01)
  *C30B 29/16* (2006.01)
  *C30B 29/60* (2006.01)
  *B29C 48/14* (2019.01)
  *C30B 7/10* (2006.01)
  *D01D 5/00* (2006.01)
  *D01F 6/70* (2006.01)
  *D01F 6/64* (2006.01)
  *B29K 67/00* (2006.01)
  *B29K 509/02* (2006.01)
  *D01F 6/62* (2006.01)

(52) U.S. Cl.
  CPC .............. *B29C 48/142* (2019.02); *C30B 7/10* (2013.01); *C30B 29/16* (2013.01); *C30B 29/60* (2013.01); *D01D 5/003* (2013.01); *D01F 1/10* (2013.01); *D01F 11/00* (2013.01); *D04H 1/728* (2013.01); *B29K 2067/046* (2013.01); *B29K 2509/02* (2013.01); *B29K 2995/006* (2013.01); *D01F 6/625* (2013.01); *D01F 6/64* (2013.01); *D01F 6/70* (2013.01); *D10B 2331/04* (2013.01); *D10B 2401/12* (2013.01); *D10B 2509/00* (2013.01)

(56) References Cited

FOREIGN PATENT DOCUMENTS

| | | |
|---|---|---|
| JP | 2014-0055367 A | 3/2014 |
| JP | 2019-0501017 A | 1/2019 |
| KR | 10-0727086 B1 | 6/2007 |
| KR | 10-2011-0064845 A | 6/2011 |
| KR | 10-2013-0090260 A | 8/2013 |
| KR | 10-2016-0088540 A | 7/2016 |
| KR | 10-2016-0090134 A | 7/2016 |
| WO | 2004-091785 A1 | 10/2004 |
| WO | 2009-096365 A1 | 8/2009 |

OTHER PUBLICATIONS

Jinkai Wang et al : "Epitaxial Growth of Urchin-Like CoSe 2 Nanorods from Electrospun Co-Embedded Porous Carbon Nanofibers and Their Superior Lithium Storage Properties", Particle and Particle Systems Characterization., vol. 34, No. 10, Sep. 5, 2017 (Sep. 5, 2017), p. 1700185, XP055671529.

International Search Report dated May 29, 2017, issued in corresponding International Patent Application No. PCT/KR2017/000343.

* cited by examiner

Production of nanofiber-nanoparticle composite using electrospinning

NANOFIBER-NANOWIRE COMPOSITE AND PREPARATION METHOD THEREFOR

CROSS-REFERENCE TO RELATED APPLICATIONS

This application is a continuation of and claims priority to PCT/KR2017/000343 filed on Jan. 10, 2017, which claims priority to Korea Patent Application No. 10-2016-0110970 filed on Aug. 30, 2016, the entireties of which are both hereby incorporated by reference.

TECHNICAL FIELD

The present disclosure relates to nanocomposites and, more particularly, to a composite produced by synthesizing a nanofiber including metal-oxide nanoparticles to a biodegradable polymer solution and growing a metal-oxide nanowire from the nanofiber through a hydrothermal method. Nanocomposite may be applied to various fields such as photocatalysts, sensors, beauty treatments, and gene transfer and therapy.

BACKGROUND

A nanofiber has a structure having a diameter of about 1 µm or less. The nanofiber is light in specific gravity and has a very large surface area per unit mass and fine spaces. Nanofibers have been applied to various fields such as space industry, fuel cell, capacitor, battery, drug delivery, and biosensor. Especially, due to very high compatibility with cells, biodegradable nanofibers are being applied to various fields including medical field such as suture, tissue regeneration, biosensor, drug delivery, and stem cell culture and cosmetic field such as mask pack.

Nanofibers have been produced using methods such as electrospinning, self-assembly, and phase separation. The self-assembly is a method for autonomous organization of molecules without stimulation. However, the self-assembly is sensitive in synthesis conditions, includes a complex synthesis procedure, and exhibits a very low yield. The phase separation is a method for synthesizing a fiber by cooling a polymer solution for a short period of time. Although the phase separation is simpler than the self-assembly, it suffers from a limitation in types of polymer. In contrast, the electrospinning is much simpler than other synthesis techniques, exhibits a much higher yield than other synthesis techniques, and does not suffer from a limitation in types of polymer.

A hydrothermal method is used as a simple method for growing inorganic nanoparticles into nanowires. In the case of zinc oxide, synthesis is possible at temperature of 90 degrees Celsius more or less. The hydrothermal method has an advantage that mass production is possible on various substrates at low temperature.

Classically, dip coating has been mainly used as a method for producing a composite of two types of materials such as a form in which a nanowire is bound to a nanofiber. In the dip coating, particles are fixed by dipping a nanofiber in a nanoparticle-containing solution for a predetermined time. However, since the particles are simply fixed onto a surface, the dip coating causes an additional process and an inconsistent nanoparticle distribution.

Accordingly, there is a need for a novel method for producing a composite of two types of materials such as a form in which a nanowire is bound to a nanofiber.

SUMMARY

Example embodiments of the present disclosure provide a method for synthesizing a nanoparticle-containing nanofiber through electrospinning by injecting zinc-oxide nanoparticles into a biodegradable polymer synthesis solution and growing zinc-oxide nanowires from the zinc-oxide nanoparticles inside the nanofiber and on a surface of the nanofiber through a hydrothermal method.

Example embodiments of the present disclosure provide a method for adjusting a density of a nanowire and spatially uniformly growing the nanowire by adjusting the amount of nanoparticles to be injected. The most important issue of a nanofiber-nanowire composite is uniformity, which resolved by solvent adjustment.

According to example embodiments of the present disclosure, a method for producing a nanofiber-nanowire composite includes: preparing a nanoparticle using a dipolar solvent; producing a nanofiber-nanoparticle composite in an electrospinning synthesis solution including the nanoparticle through electrospinning; and growing a nanowire from the nanoparticle by hydrothermally synthesizing a dried nanofiber-nanoparticle composite.

In example embodiments of the present disclosure, the nanoparticle may be a metal-oxide nanoparticle, and the nanofiber may include a biodegradable polymer.

In example embodiments of the present disclosure, preparing the nanoparticle may include: dissolving a zinc-oxide precursor in the dipolar solvent to prepare a zinc-oxide precursor solution; heating hexadecyltrimethylammonium bromide (($C_{16}H_{33}$)$N(CH_3)_3Br$) as a cation surfactant and the zinc-oxide precursor solution at a temperature between 40 and 60 degrees Celsius; dissolving sodium hydroxide (NaOH) in the dipolar solvent to prepare and heat a sodium hydroxide solution at a temperature between 40 and 60 degrees Celsius; precipitating the nanoparticle by mixing the sodium hydroxide with the zinc-oxide precursor solution in which the cation surfactant is mixed and reacting the mixed solution at a temperature between 40 and 60 degrees Celsius; and cleaning the precipitated nanoparticle with a cleaning agent and drying the cleaned nanoparticle to extract a zinc-oxide nanoparticle.

In example embodiments of the present disclosure, producing the nanofiber-nanoparticle composite in the electrospinning synthesis solution including the nanoparticle through the electrospinning may include: dissolving a nanofiber synthesis polymer in an organic solvent to produce an electrospinning composite solution; dissolving a dried nanoparticle in the dipolar solvent; dispersing the nanoparticle in the dipolar solvent; injecting a solution including the nanoparticle into the electrospinning composite solution and agitating the injected solution with the electrospinning composite solution; and producing a nanofiber-nanoparticle composite from the electrospinning composite solution using an electrospinning device. The nanofiber synthesis polymer may be a poly(L-lactide) (PLLA) polymer, and the organic solvent may be chloroform ($CHCl_3$).

In example embodiments of the present disclosure, growing the nanowire from the nanoparticle by hydrothermally synthesizing the dried nanofiber-nanoparticle composite may include adding the nanofiber-nanoparticle composite to a nanowire composite aqueous solution including a zinc-oxide precursor and hexamethylenetetramine (HMTA).

In example embodiments of the present disclosure, the zinc-oxide precursor may be zinc nitrate hexahydrate (($Zn(NO_3)_2 + 6H_2O$)). The nanowire synthesis aqueous solution may include ammonium chloride (NH4Cl2) and polyethylenimine $(H(NHCH_2CH_2)_nNH_2)$ (PEI).

In example embodiments of the present disclosure, the dipolar solvent may include at least one of ethanol, methanol, dimethylformamide (DMF), and tetrahydrofuran (THF).

In example embodiments of the present disclosure, the biodegradable polymer may include at least one of PLLA, polyhydroxybutyrate (PHB), polyurethane (PU), and polycarbonate (PC).

In example embodiments of the present disclosure, the nanofiber may be synthesized from a polymer whose melting point is higher than or equal to 90 to 92 degrees Celsius.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

FIG. 1a shows a preparing of the nanoparticle. FIG. 1b shows a production of nanofiber-nanoparticle composite using electrospinning. FIG. 1c shows a production of nanofiber-nanowire composite using a hydrothermal method.

FIG. 5a shows a low-resolution TEM image of a PLLA nanofiber-ZnO nanowire composite. FIG. 5b shows a TEM image of a ZnO nanowire of the PLLA nanofiber-ZnO nanowire composite. FIG. 5c shows a high-resolution image of the ZnO nanowire. FIG. 5d shows a selected area electron diffraction (SAED) image of the ZnO nanowire.

DETAILED DESCRIPTION

Figure 1A:
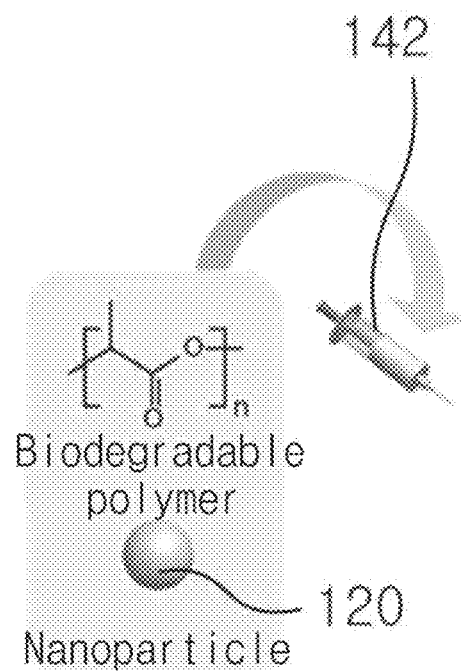
FIGS. 1a, 1b, and 1c are process diagrams simply illustrating a producing process of a nanofiber-nanowire composite according to an example embodiment of the present disclosure.

According to an example embodiment of the present disclosure, a nanofiber-nanoparticle composite is synthesized in an electrospinning synthesis solution into which nanoparticles are injected. The nanofiber-nanoparticle composite is converted into a nanofiber-nanowire composite, which is an end product, by growing nanowires from nanoparticles exposed onto a surface of the nanofiber-nanoparticle composite through a hydrothermal method. After a nanofiber-nanoparticle composite in which nanoparticles are uniformly included is obtained by electrospinning an electrospinning synthesis solution in which nanoparticles are uniformly distributed, a nanofiber-nanowire composite may be easily produced by a hydrothermal method.

According to an example embodiment of the present disclosure, an additional process such as heat treatment performed in a conventional method is not required. That is, a composite of higher productivity and uniformity than a composite produced by the conventional method may be produced.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

Figure 1B:
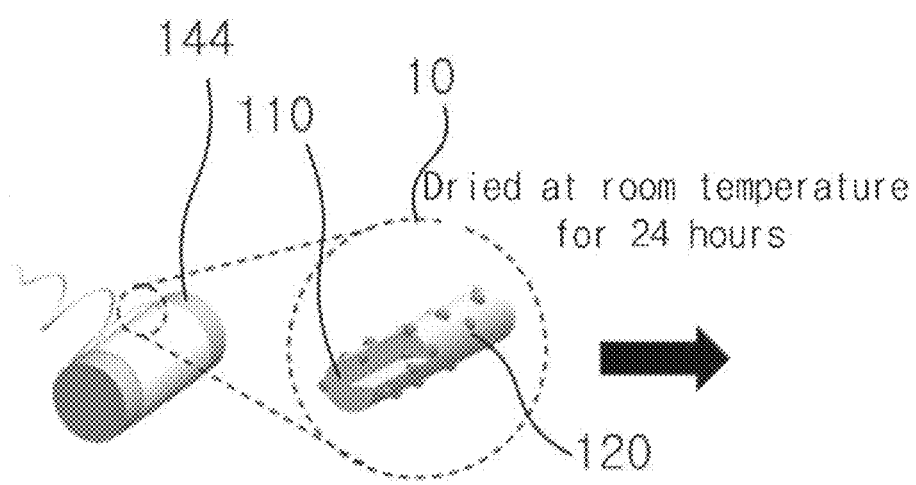
Figure 1C:
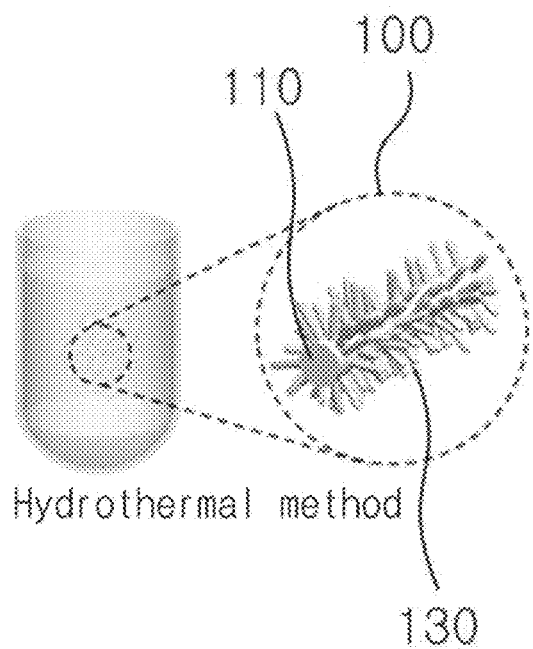

FIGS. 1a, 1b, and 1c are process diagrams simply illustrating a producing process of a nanofiber-nanowire composite according to an example embodiment of the present disclosure. FIG. 1a shows a preparing of the nanoparticle. FIG. 1b shows a production of nanofiber-nanoparticle composite using electrospinning. FIG. 1c shows a production of nanofiber-nanowire composite using a hydrothermal method.

Referring to FIGS. 1a, 1b, and 1c, a method for producing a nanofiber-nanowire composite 100 includes preparing a nanoparticle 120 using a dipolar solvent; producing a nanofiber-nanoparticle composite 10 in an electrospinning synthesis solution including the nanoparticle 120 through electrospinning; and growing a nanowire 130 from the nanoparticle 120 by hydrothermally synthesizing a dried nanofiber-nanoparticle composite 10. The nanoparticle 10 may be a metal-oxide nanoparticle, and the nanofiber may include a biodegradable polymer. The nanowire may be a metal-oxide nanowire. The dipolar solvent may include at least one of ethanol, methanol, dimethylformamide (DMF), and tetrahydrofuran (THF). The biodegradable polymer may include at least one of PLLA, polyhydroxybutyrate (PHB), polyurethane (PU), and polycarbonate (PC).

[Synthesis of Zinc-Oxide (ZnO) Nanoparticle]

The nanoparticle 120 may be metal oxide, e.g., zinc oxide. The nanoparticle 120 may be modified into various metal oxides as long as it can be grown by a hydrothermal method.

Preparing the nanoparticle 120 may include dissolving a zinc-oxide precursor, e.g., zinc nitrate hexahydrate $(Zn(NO_3)_2 \cdot 6H_2O)$ in the dipolar solvent to prepare a zinc-oxide precursor solution; heating hexadecyltrimethylammonium bromide $((C_{16}H_{33})N(CH_3)_3Br)$ as a cation surfactant and the zinc-oxide precursor solution at a temperature between 40 and 60 degrees Celsius; dissolving sodium hydroxide (NaOH) in the dipolar solvent to prepare and heat a sodium hydroxide solution at a temperature between 40 and 60 degrees Celsius; precipitating the nanoparticle 120 by mixing the sodium hydroxide with the zinc-oxide precursor solution in which the cation surfactant is mixed and reacting the mixed solution at a temperature between 40 and 60 degrees Celsius; and cleaning and drying the precipitated nanoparticle 120 with a cleaning agent (e.g., ethanol) to extract a zinc-oxide nanoparticle.

More specifically, to synthesize the zinc-oxide nanoparticle, 50 mM of zinc nitrate hexahydrate ($Zn(NO_3)_2+6H_2O$) is put and dissolved in ethanol ($C_2H_2OH$), which is a dipolar solvent, through an injection portion of a 100 ml flask and is heated at a temperature between 40 and 60 degrees Celsius for one to two hours together with a cation surfactant such as 100 mM of hexadecyltrimethylammonium bromide (CTAB, ($C_{16}H_{33}$)N($CH_3$)$_3$Br)).

In another 100 mL flask, 100 mM of sodium hydroxide (NaOH) is put in the dipolar solvent (e.g., ethanol), is dissolved using an ultrasonic cleaner, and is heated at a temperature between 40 and 60 degrees Celsius. When the sodium hydroxide (NaOH) is dissolved, it is put in the flask in which the zinc-oxide precursor is dissolved and reacts with the dissolved zin-oxide precursor at temperature between 40 and 60 degrees Celsius for one to two hours. The reacting sodium hydroxide (NaOH) is cleaned and dried with a cleaning agent (e.g., ethanol) four or five times to produce the zinc-oxide nanoparticle 120.

The dipolar solvent may include at least one of ethanol, methanol, dimethylformamide (DMF), and tetrahydrofuran (THF).

[Synthesis of PLLA Nanofiber-Nanoparticle Composite]

Referring to FIGS. 1a, 1b, and 1c, producing the nanofiber-nanoparticle composite 10 in the electrospinning synthesis solution including the nanoparticle 120 through the electrospinning includes dissolving a nanofiber synthesis polymer in an organic solvent to produce an electrospinning composite solution; dissolving a dried nanoparticle in the dipolar solvent; dispersing the nanoparticle in the dipolar solvent; injecting a solution including the nanoparticle into the electrospinning composite solution and agitating the injected solution with the electrospinning composite solution; and producing a nanofiber-nanoparticle composite from the electrospinning composite solution using an electrospinning device. The organic solvent may be chloroform (CHCl3). The dipolar solvent may include at least one of ethanol, methanol, dimethylformamide (DMF), and tetrahydrofuran (THF). The nanofiber synthesis polymer may include at least one of poly(L-lactide) (PLLA), polyhydroxybutyrate (PHB), polyurethane (PU), and polycarbonate (PC). The nanofiber synthesis polymer may be a biodegradable polymer or a polymer whose melting point is between 90 and 95 degrees Celsius. The polymer may be polyacrylic acid (PAA), polystyrene sulfonic acid (PSSA), polymethyl methacrylate (PMMA), polymethylacrylate (PMA), polyvinyl acetate (PVAc), polyvinyl pyrrolidone (PVP), polymethyl alcohol (PVA), polyvinylidene fluoride (PVDF), polyvinyl chloride (PVC), polyethylene oxide (PEO), propylene oxide (PPO) or polystyrene (PS).

More specifically, to prepare an electrospinning synthesis solution, 140 mg of poly(L-lactide) (PLLA) which is a nanofiber synthesis polymer is put and melted in 0.8 mL of dipolar solvent (e.g., chloroform ($CHCl_3$)). The dried zinc-oxide nanoparticle is dissolved in 0.2 mL of the dipolar solvent (e.g., ethanol ($C_2H_2OH$)). The dipolar solvent may uniformly disperse nanoparticles.

The nanoparticles are more uniformly dispersed using an apparatus such as a vortex mixer, shaker or an ultrasonic cleaner. After a solution including a nanoparticle is injected into a solution including a PLLA polymer, they are agitated using various apparatuses. Thus, the electrospinning synthesis solution is prepared.

The electrospinning device includes a high voltage supply, a syringe pump 142 configured to emit a solution, and a collector 144 configured to collect a nanofiber.

By applying a high voltage to a tip of the syringe pump 142, a nanofiber is spun by evaporation of the organic solvent and the dipolar solvent using a surface tension and an electrostatic repulsion of a solution to be synthesized at the collector 144.

During the electrospinning, a flow rate of the electrospinning synthesis solution of the syringe pump 142 was set to 1 mL/hr and a voltage was set to a DC voltage of 10 kV. A spinning needle is a 30-gage needle of nickel-alloy. A distance between the collector 144 and the spinning needle was set to 10 cm. After the electrospinning, the produced PLLA nanofiber-ZnO nanoparticle composite is dried under an atmosphere at room temperature for 24 hours to complete a nanofiber-nanoparticle composite.

[Synthesis of PLLA Nanofiber-Nanowire Composite]

Growing the nanowire 130 from the nanoparticle 120 by hydrothermally synthesizing the dried nanofiber-nanoparticle composite 10 includes adding the nanofiber-nanoparticle composite to a nanowire composite aqueous solution including a zinc-oxide precursor and hexamethylenetetramine (HMTA). The zinc-oxide precursor may be zinc nitrate hexahydrate (($Zn(NO_3)_2+6H_2O$).

The nanowire synthesis aqueous solution may include ammonium chloride ($NH_4Cl_2$) and polyethylenimine ($H(NHCH_2CH_2)_nNH_2$) (PEI).

More specifically, a hydrothermal method was used to grow into a ZnO nanowire from the PLLA nanofiber-ZnO nanoparticle composite. According to the hydrothermal method, in an aqueous solution in which 10 mM of zinc nitrate hexahydrate ($Zn(NO_3)_2+6H_2O$), 10 mM of hexamethylenetetramine ($C_6H_{12}N_4$) (HMTA), 6 mM of ammonium chloride ($NH_4Cl_2$), and 10 mM of polyethylenimine ($H(NHCH_2CH_2)_nNH_2$) (PEI) are dissolved, the ZnO nanowire may be grown through a hydrothermal reaction at temperature between 90 and 95 degrees Celsius for one to two hours. As the zinc-oxide precursors, zinc nitrate hexahydrate and HMTA grow the ZnO nanowire. As additives, the ammonium chloride and PEI contribute to vertical growth of the nanowire. Thus, the PLLA nanofiber-ZnO nanowire composite 100 is completed.

Figure 2:
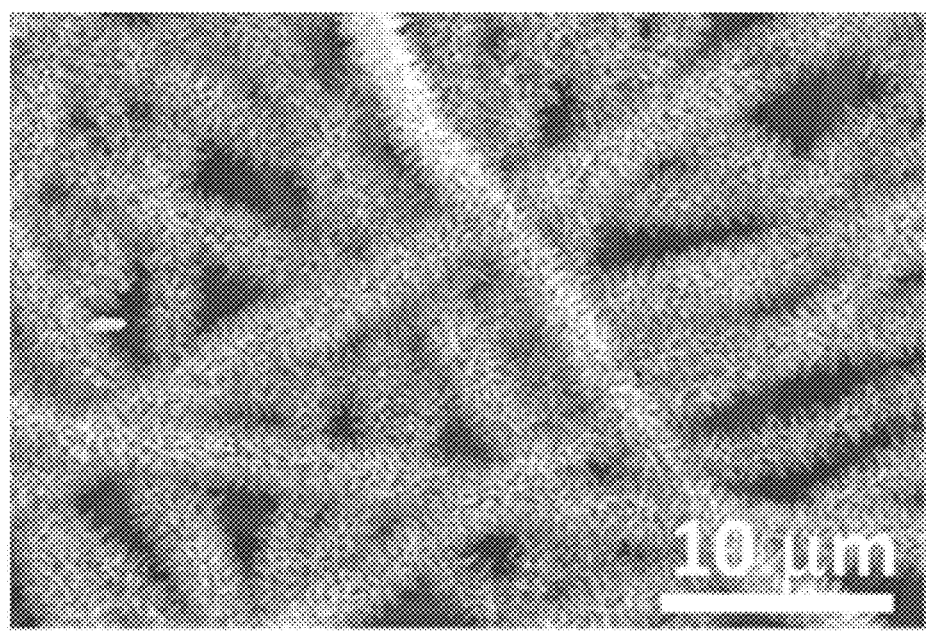
FIG. 2 shows a scanning electron microscopy (SEM) image of a PLLA nanofiber-ZnO nanowire composite according to an example embodiment of the present disclosure.

FIG. 2 shows a scanning electron microscopy (SEM) image of a PLLA nanofiber-ZnO nanowire composite according to an example embodiment of the present disclosure.

Referring to FIG. 2, the PLLA nanofiber-ZnO nanowire composite 100 was produced through a hydrothermal reaction for two hours. The ZnO nanowire may be grown to have a length between 1.0 and 1.3 μm. A length of the ZnO nanowire thermally reacting for an hour is between 0.7 and 0.8 μm. A diameter of the ZnO nanowire is between about 50 and about 80 nm. The ZnO nanowire is grown at the PLLA nanofiber with a spatially uniform density.

Figure 3:
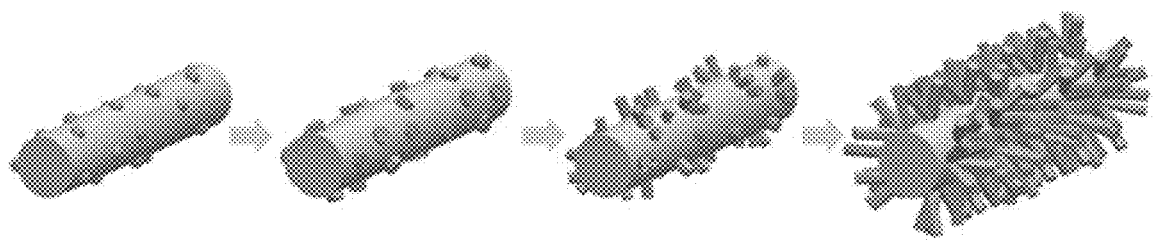
FIG. 3 shows a procedure of growing ZnO nanoparticles into nanowires in a hydrothermal reaction.

FIG. 3 shows a procedure of growing ZnO nanoparticles into nanowires in a hydrothermal reaction.

Referring to FIG. 3, the nanowire is linearly grown. The nanowire may be grown to a plurality of strands from a nanoparticle exposed onto a surface of the nanofiber.

Figure 4:
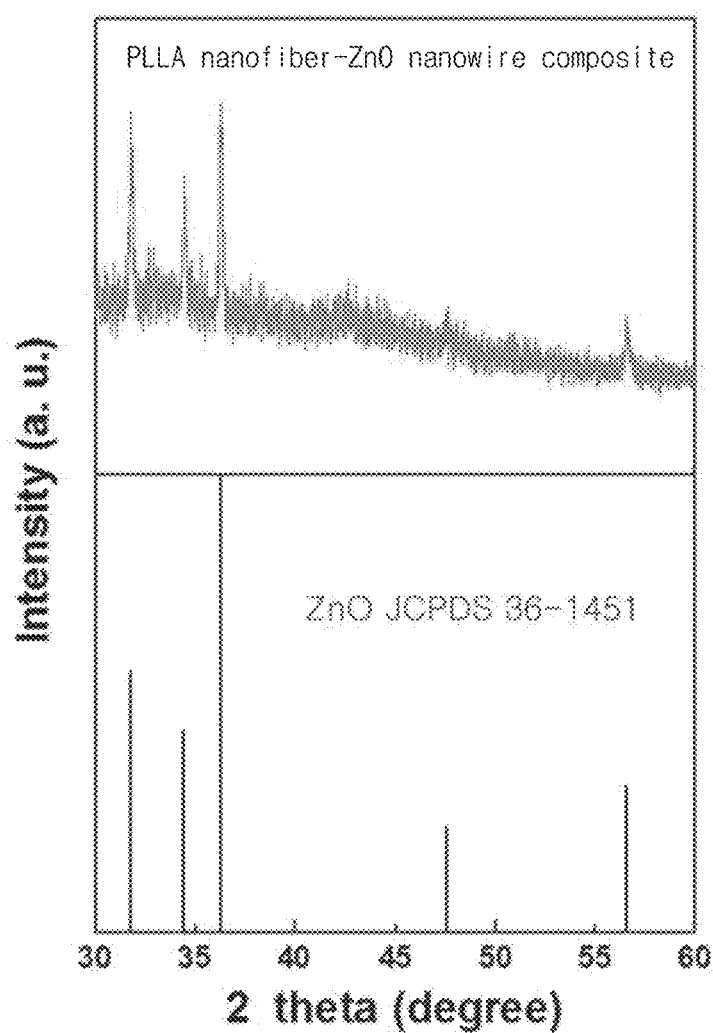
FIG. 4 shows an X-ray diffraction (XRD) (upper image) and ZnO JCPDS (Joint Committee on Powder Diffraction Standards) card 36-1451 (lower image) of a PLLA nanofiber-ZnO nanowire composite according to an example embodiment of the present disclosure.

FIG. 4 shows an X-ray diffraction (XRD) (upper image) and ZnO JCPDS (Joint Committee on Powder Diffraction Standards) card 36-1451 (lower image) of a PLLA nanofiber-ZnO nanowire composite according to an example embodiment of the present disclosure.

Referring to FIG. 4, diffraction peaks of a ZnO nanowire may be shown at angles of 31.77°, 34.42°, 36.25°, 47.54°, and 56.60°, respectively. As compared to ZnO JCPDS(14-

1451), the diffraction peaks are indexed to (100), (002), (101), (102), (110) planes, respectively. The ZnO nanowire is in a crystal state.

Figure 5A:
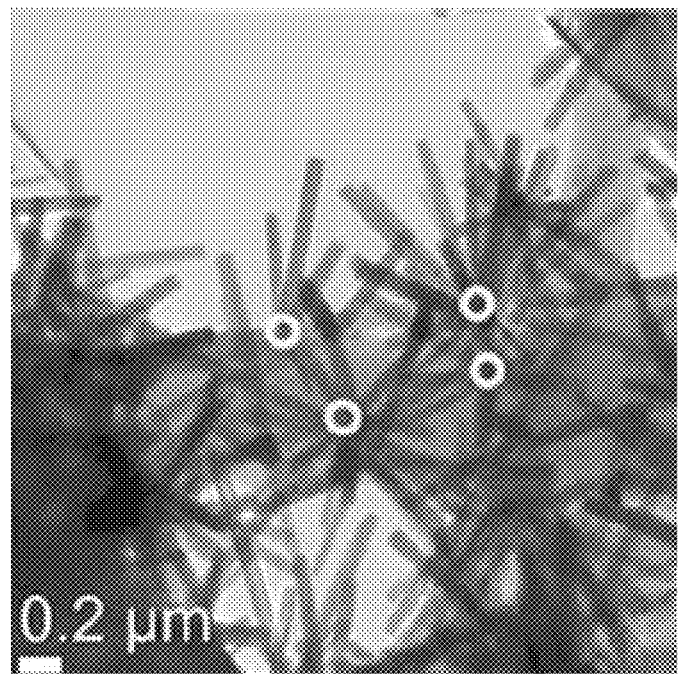
FIGS. 5a, 5b, 5c, and 5d show a transmission electron microscopy (TEM) image and a selected area electron diffraction (SAED) image of a PLLA nanofiber-ZnO nanowire composite produced through a hydrothermal reaction for an hour.
Figure 5B:
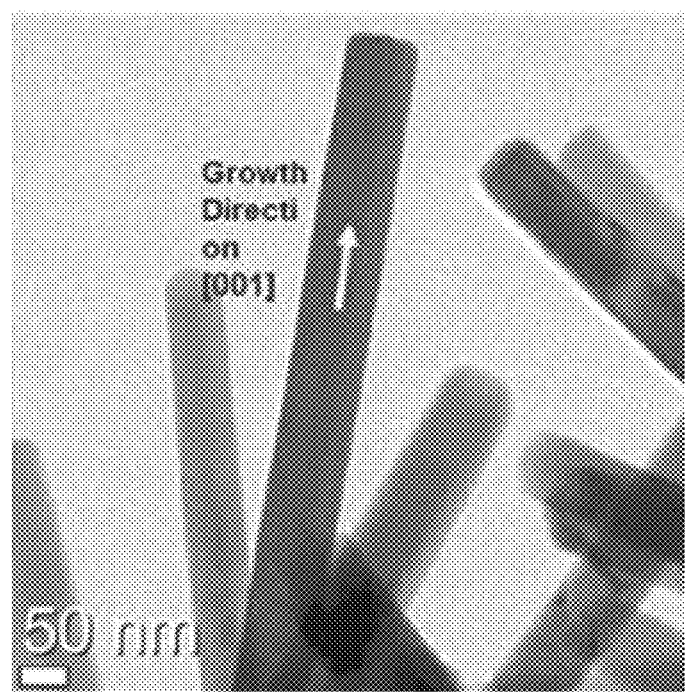
Figure 5C:
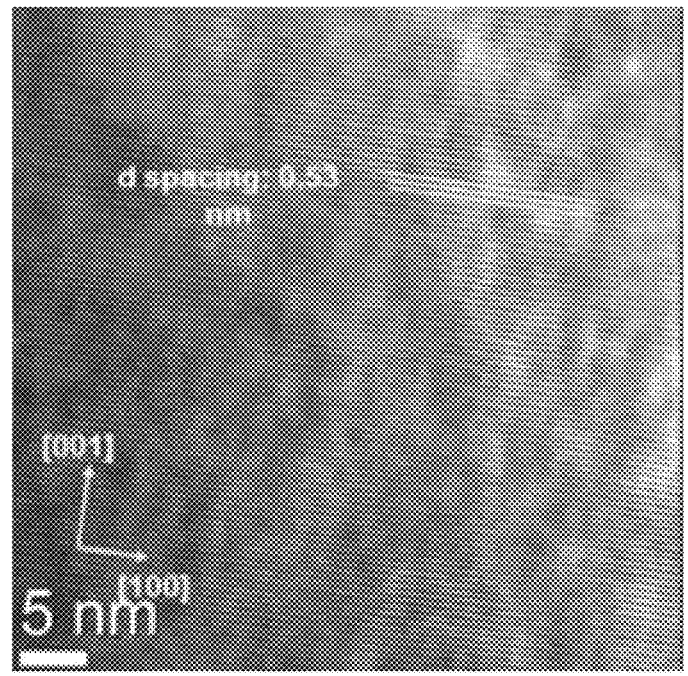
Figure 5D:
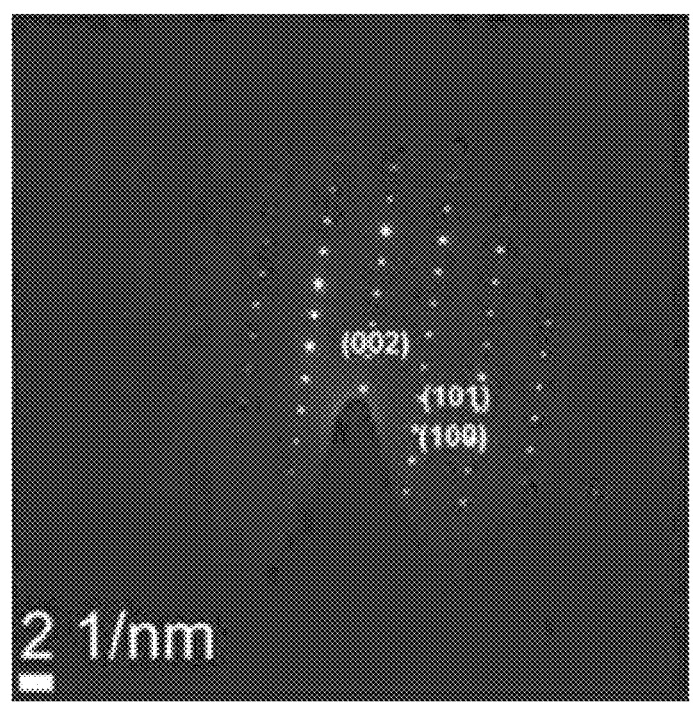

FIGS. 5a, 5b, 5c, and 5d show a transmission electron microscopy (TEM) image and a selected area electron diffraction (SAED) image of a PLLA nanofiber-ZnO nanowire composite produced through a hydrothermal reaction for an hour. FIG. 5a shows a low-resolution TEM image of a PLLA nanofiber-ZnO nanowire composite. FIG. 5b shows a TEM image of a ZnO nanowire of the PLLA nanofiber-ZnO nanowire composite. FIG. 5c shows a high-resolution image of the ZnO nanowire. FIG. 5d shows a selected area electron diffraction (SAED) image of the ZnO nanowire.

In FIG. 5a, an image is a low-resolution TEM image of a PLLA nanofiber-ZnO nanowire composite 100 and shows a composite in which a nanofiber and a nanowire coexist.

In FIG. 5b, an image is a TEM image of a ZnO nanowire of the PLLA nanofiber-ZnO nanowire composite. The ZnO nanowire is grown in a [001] direction.

In FIG. 5c, an image is a high-resolution image of the ZnO nanowire. A plane space of the ZnO nanowire grown in the [001] direction is 0.53 nm.

In FIG. 5d, an image is a selected area electron diffraction (SAED) image of the ZnO nanowire. A crystallizability and a growth direction of the ZnO nanowire were checked.

Figure 6:
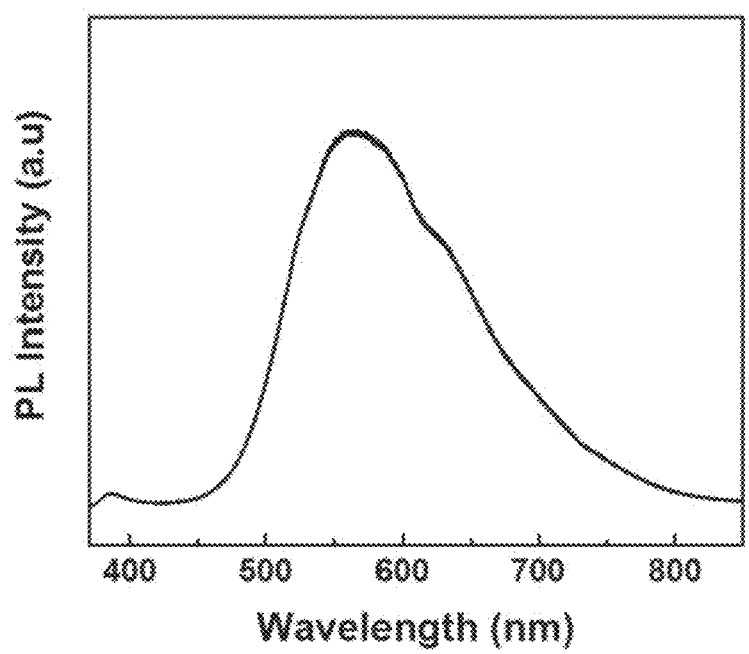
FIG. 6 shows a photoluminescence (PL) of a PLLA nanofiber-ZnO nanowire composite according to an example embodiment of the present disclosure.

FIG. 6 shows a photoluminescence (PL) of a PLLA nanofiber-ZnO nanowire composite according to an example embodiment of the present disclosure.

Referring to FIG. 6, there are two main peaks. A first peak is an ultraviolet (UV) radiation peak at a wavelength of 385 mm, and a second peak is a yellow-green radiation peak at a wavelength of 565 nm. The first peak is a result of direct rebonding of free electrons, and the second peak indicates a radiation caused by inter-grating oxygen particles from deep-level.

A representative conventional method associated with a method for producing a nanofiber-nanowire composite is deep coating. A nanoparticle is attached to a surface of a nanofiber by dipping a nanofiber in a solution including the nanoparticle for a fixed period of time. The above-mentioned method is the most basic method and may be easily carried out, which is an advantage. However, the above-mentioned method encounters disadvantages as follows. One of the disadvantages is to prepare a nanoparticle solution. A separate solution should be prepared to uniformly attach a nanoparticle to a nanofiber for the same period of time. This increases a probability of contamination and non-uniform attachment of nanoparticle during the preparation of the nanoparticle solution. Moreover, since the amount of nanoparticle is determined depending on dipping time of the solution, it is not easy to adjust a density. Due to these phenomena, stability of a nanofiber subjected to deep coating is reduced. This may be overcome by additionally performing a heat treatment for structural stability and immobilization of the nanoparticle.

An example embodiment of the present disclosure provides a method which is capable of overcoming the above-described disadvantages. According to the method, a nanoparticle is not simply attached to a nanofiber and a nanofiber-nanoparticle composite may be easily produced.

According to an example embodiment of the present disclosure, a dipolar solvent (e.g., ethanol) is used to disperse nanoparticles to a polymer synthesis solution. The dipolar solvent may allow the nanoparticles to be uniformly dispersed in an organic solvent in which a polymer is dissolved. The nanofiber-nanoparticle composite may be produced by electrospinning the polymer synthesis solution. In the case of a zinc-oxide nanoparticle, a nanowire may be grown using a hydrothermal method.

According to an example embodiment of the present disclosure, a nanowire may be grown without performing an additional process on a nanofiber-nanoparticle composite. A homogeneous nanowire may be produced by overcoming solution contamination and non-uniform dispersion of nanoparticles that may occur in deep coating.

Additionally, a nanofiber-nanowire composite according to an example embodiment of the present disclosure is bio-friendly by using a biodegradable polymer and is decomposed in a living body with the lapse of time. Since the nanofiber-nanowire composite is harmless to a human body and has cell-compatibility, it may be applied to various biomedical fields such as medical materials, tissue regeneration, biosensors, drug delivery, and cosmetics. Furthermore, the nanofiber-nanowire composite may be applied to various fields according to nanoparticle and nanowire characteristics which may be complex.

Although the present disclosure and its advantages have been described in detail, it should be understood that various changes, substitutions and alterations can be made herein without departing from the spirit and scope of the disclosure as defined by the following claims.

What is claimed is:

1. A method for producing a nanofiber-nanowire composite, the method comprising:
    preparing a nanoparticle;
    producing a nanofiber-nanoparticle composite in an electrospinning synthesis solution including the nanoparticle and a dipolar solvent through electrospinning; and
    growing a nanowire from the nanoparticle of the nanofiber-nanoparticle composite by hydrothermally synthesizing,
    wherein producing the nanofiber-nanoparticle composite in the electrospinning synthesis solution including the nanoparticle and a dipolar solvent through the electrospinning comprises:
        dissolving a nanofiber synthesis polymer in an organic solvent to produce an electrospinning composite solution;
        dispersing the nanoparticle in the dipolar solvent;
        injecting the dipolar solvent and the nanoparticles dispersed therein into the electrospinning composite solution and agitating a resulting mixture thereof; and
        producing the nanofiber-nanoparticle composite from the mixture using an electrospinning device.

2. The method as set forth in claim 1, wherein the nanoparticle is a metal-oxide nanoparticle, and
    wherein a nanofiber of the nanofiber-nanoparticle composite includes a biodegradable polymer.

3. The method as set forth in claim 2, wherein preparing the nanoparticle comprises:
    dissolving a zinc-oxide precursor in a dipolar solvent to prepare a zinc-oxide precursor solution;
    heating hexadecyltrimethylammonium bromide $((C_{16}H_{33})N(CH_3)_3Br)$ as a cation surfactant and the zinc-oxide precursor solution at a temperature between 40 and 60 degrees Celsius;
    dissolving sodium hydroxide (NaOH) in the dipolar solvent to prepare and heat a sodium hydroxide solution at a temperature between 40 and 60 degrees Celsius;
    precipitating the nanoparticle by mixing the sodium hydroxide solution with the zinc-oxide precursor solution in which the cation surfactant is mixed and reacting the mixed solution at a temperature between 40 and 60 degrees Celsius; and cleaning the precipitated nanoparticle with a cleaning agent and drying the cleaned nanoparticle to extract a zinc-oxide nanoparticle.

4. The method as set forth in claim 1, wherein the nanofiber synthesis polymer is a poly(L-lactide) (PLLA) polymer, and wherein the organic solvent is chloroform ($CHCl_3$).

5. The method as set forth in claim 1, wherein growing the nanowire from the nanoparticle of the nanofiber-nanoparticle composite by hydrothermally synthesizing comprises:

adding the nanofiber-nanoparticle composite to a nanowire composite aqueous solution including a zinc-oxide precursor and hexamethylenetetramine (HMTA).

6. The method as set forth in claim 5, wherein the zinc-oxide precursor is zinc nitrate hexahydrate (($Zn(NO_3)_2$+$6H_2O$), and wherein a nanowire synthesis aqueous solution of the hydrothermally synthesizing includes ammonium chloride ($NH_4Cl_2$) and polyethylenimine ($H(NHCH_2CH_2)_nNH_2$) (PEI).

7. The method as set forth in claim 1, wherein the dipolar solvent includes at least one of ethanol, methanol, dimethylformamide (DMF), and tetrahydrofuran (THF).

8. The method as set forth in claim 2, wherein the biodegradable polymer includes at least one of PLLA, polyhydroxybutyrate (PHB), polyurethane (PU), and polycarbonate (PC).

9. The method as set forth in claim 1, wherein the nanofiber of the nanofiber-nanoparticle composite is synthesized from a polymer having a melting point ranging from 90 to 92 degrees Celsius.

* * * * *